United States Patent
Balasubramanian et al.

(10) Patent No.: US 9,130,549 B2
(45) Date of Patent: Sep. 8, 2015

(54) MULTIPLEXER FLOP

(71) Applicant: Cavium, Inc., San Jose, CA (US)

(72) Inventors: Suresh Balasubramanian, Shrewsbury, MA (US); Nitin Mohan, Northborough, MA (US); Manan Salvi, Somerville, MA (US)

(73) Assignee: Cavium, Inc., San Jose, CA (US)

( * ) Notice: Subject to any disclaimer, the term of this patent is extended or adjusted under 35 U.S.C. 154(b) by 0 days.

(21) Appl. No.: 14/217,935

(22) Filed: Mar. 18, 2014

(65) Prior Publication Data

US 2015/0061741 A1    Mar. 5, 2015

Related U.S. Application Data

(60) Provisional application No. 61/872,383, filed on Aug. 30, 2013.

(51) Int. Cl.
  *H03K 3/03*    (2006.01)
  *H03K 3/037*   (2006.01)

(52) U.S. Cl.
  CPC .................... *H03K 3/0372* (2013.01)

(58) Field of Classification Search
  CPC ........................................ H03K 3/03
  USPC .............................. 327/202, 199
  See application file for complete search history.

(56) References Cited

U.S. PATENT DOCUMENTS

| | | | |
|---|---|---|---|
| 6,181,179 B1 | 1/2001 | Kanba | |
| 7,274,234 B2 * | 9/2007 | Branch et al. | 327/203 |
| 7,345,518 B2 * | 3/2008 | Branch et al. | 327/203 |
| 7,375,567 B2 * | 5/2008 | Branch et al. | 327/203 |
| 7,872,513 B2 * | 1/2011 | Uchida | 327/203 |
| 8,352,815 B2 | 1/2013 | Frederick, Jr. | |
| 8,525,565 B2 | 9/2013 | Rahman et al. | |
| 2002/0029355 A1 * | 3/2002 | Sakamoto et al. | 713/503 |
| 2006/0061407 A1 * | 3/2006 | Biswurm et al. | 327/407 |
| 2008/0115025 A1 | 5/2008 | Frederick | |
| 2015/0061740 A1 | 3/2015 | Balasubramanian | |

* cited by examiner

*Primary Examiner* — Ryan Jager
(74) *Attorney, Agent, or Firm* — Hamilton, Brook, Smith & Reynolds, P.C.

(57) ABSTRACT

In an embodiment, a flip flop circuit includes a master latch and a slave latch. The master latch comprises a storage element, a first data leg, and a second data leg. The first and second data legs may be coupled to the storage element. Clock selection logic may be coupled to the first and second data legs. The clock selection logic may have a select input for selecting between the first and second data legs. The slave latch may be coupled to the master latch.

19 Claims, 3 Drawing Sheets

MULTIPLEXER FLOP

RELATED APPLICATION

This application claims the benefit of U.S. Provisional Application No. 61/872,383, filed on Aug. 30, 2013. The entire teachings of the above application are incorporated herein by reference.

BACKGROUND

The capability to reduce logic depth and improve frequency of digital circuits is a chief concern of customers of products that incorporate complex circuitry. Many different forms of circuits are used for products, by commercial and industrial customers, including Integrated Circuits (ICs), Complementary Metal-Oxide-Semiconductors (CMOS), electronic circuits, semiconductors, Very Large Scale Integrated Circuits (VLSI ICs), Application Specific Integrated Circuits (ASICs), circuitry on printed circuit boards (PCBs), microprocessors (also known as "processors"), nanotechnology circuits, and other types of circuits. With increasing functionality, circuitry is growing more dense and more complex, and increasing circuit frequency is becoming more important. High-performance digital logic circuits commonly include a multiplexer (also known as "mux") combined with a flip-flop (also known as a "flip flop" or "flop").

Especially for high-volume customers of ICs, having an ability to decrease logic depth translates directly into cost savings. For a multi-gigahertz processor, a logic depth improvement that saves just half of a gate delay may result in a substantial frequency speedup of 8 to 10 percent. Also, having a multiplexer flip-flop circuit that reduces real-estate on the IC may provide additional cost savings. For at least these reasons, there is a need for improved multiplexer flip-flop circuitry.

SUMMARY

The present approach is directed to a method of reducing logic depth for a circuit by coupling a multiplexer with a flip flop. In particular, a first stage of the multiplexer is moved into the flip flop and a second stage of the multiplexer is moved from data logic of the multiplexer to clock logic of the multiplexer. The resulting circuit benefits from reduced logic depth and increased clock frequency.

In an embodiment, a flip flop circuit includes a master latch and a slave latch. The master latch comprises a storage element, a first data leg, and a second data leg. The first and second data legs may be coupled to the storage element. Clock selection logic may be coupled to the first and second data legs. The clock selection logic may have a select input for selecting between the first and second data legs. The slave latch may be coupled to the master latch.

In the flip flop circuit, the clock selection logic may comprise two NOR gates. In the flip flop circuit, each data leg may receive a plurality of data inputs. Each data leg may comprise a combinatorial logic block that is coupled to a transmission gate. The combinatorial logic block may include a single-stage of a multiplexer. The combinatorial logic block may comprise at least one complex gate, including but not limited to a single-stage complex gate, such as an AND-OR-INVERT (AOI) gate or OR-AND-INVERT (OAI) gate.

In the flip flop circuit, the clock selection logic may have a single clock input. The select input and the single clock input may be operatively coupled by the clock selection logic to provide generated clocks. The generated clocks may include a first generated clock and second generated clock. The first generated clock output may enable a data output of the first leg to a first node of the storage element. The second generated clock output may enable a data output of the second leg to the first node of the storage element. Each generated clock may be inverted for an active low enable input, to enable the data output of each data leg.

The flip flop circuit may have a single clock input. The slave latch may comprise a transmission gate that drives a slave storage element. The slave latch may have a data input that drives a transmission gate, an output of the transmission gate driving a slave storage element. The transmission gate may be enabled by the single clock input. The single clock input may be inverted for an active low enable input, to enable the transmission gate.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Figure 1:
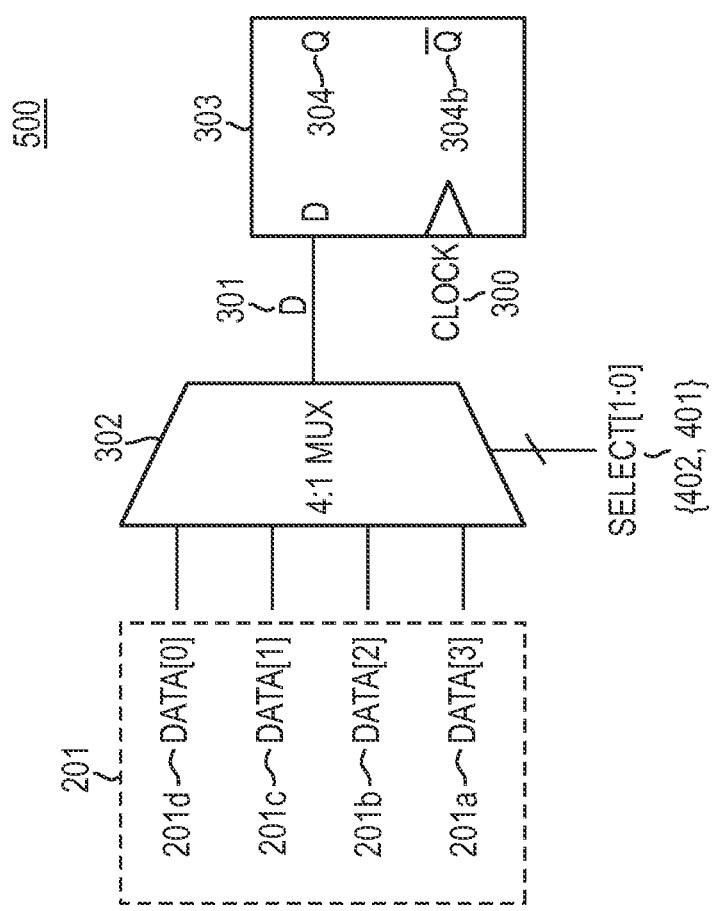
FIG. 1 illustrates a block diagram of a 4-input mux flop.

High speed digital datapaths in modern high-performance processors commonly require high fan-in multiplexers (muxes) followed by a flop. As illustrated in FIG. 1, these two elements (a mux 302 and a flop 303) may be combined into one cell 500 (a mux flop). A 4-to-1 mux 302 uses a 2-bit select line (collectively 402, 401) to select a one-bit data line (one of 201a, 201b, 201c, or 201d) from a set of data lines 201 (collectively, 201a, 201b, 201c, and 201d). In addition, as illustrated in FIG. 1, a flop 303 takes a clock 300 and data 301 as input, and outputs registered data 304 and an inverted version of the registered data 304b.

Figure 2:
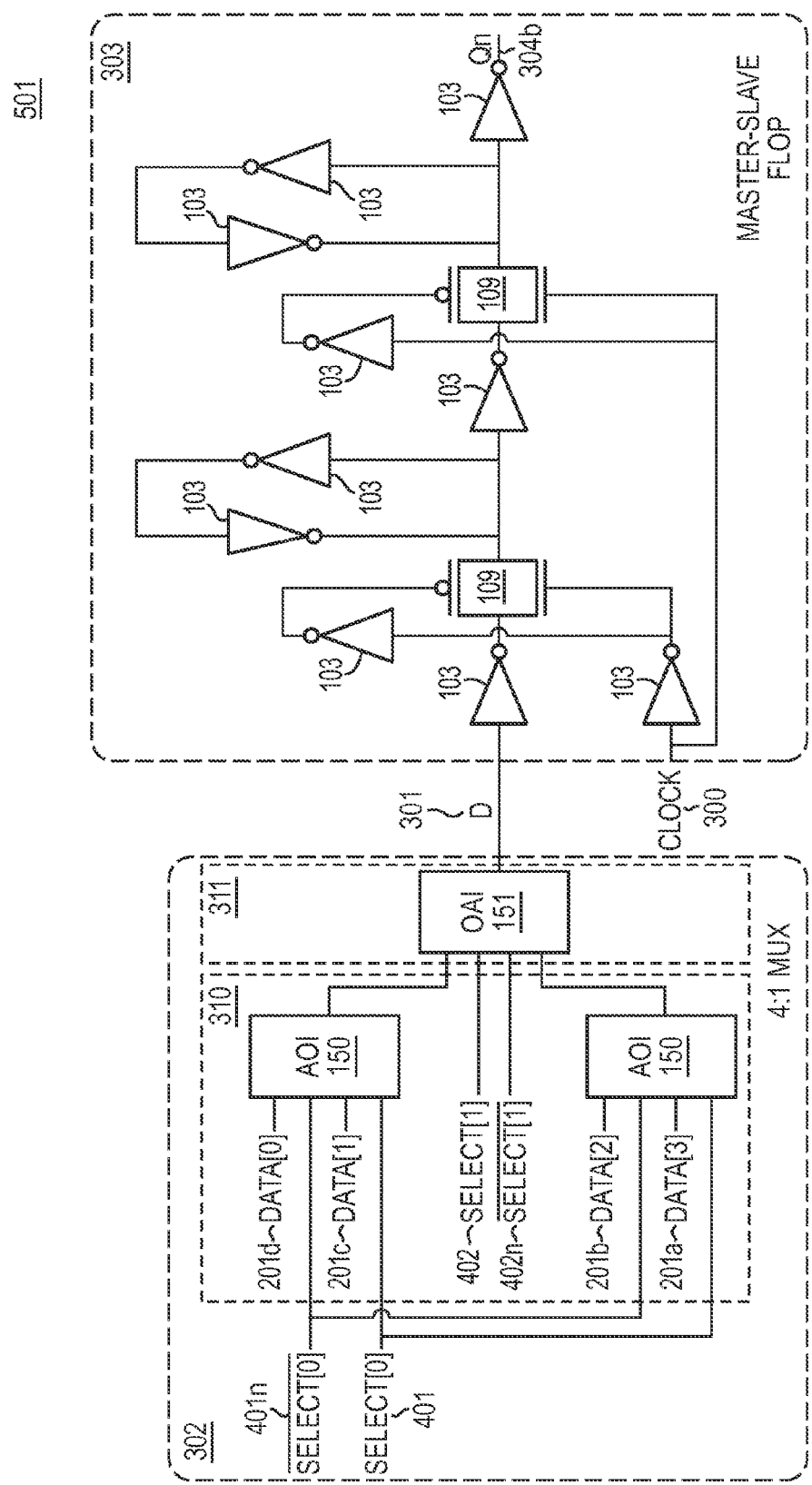
FIG. 2 illustrates an implementation of a 4-input mux flop.

For an acceptable noise margin in state-of-the-art technologies (including but not limited to CMOS technologies), it is generally understood that no more than 3 transistors may be stacked in series. As shown in FIG. 2, an implementation of the 4-input mux 302 with static CMOS logic often uses at least two logic stages, including a first stage 310 and a second stage 311. Note that the implementation in FIG. 2 is not limited to CMOS. As shown in FIG. 2, the first multiplexer stage 310 may include at least one single-stage complex gate such as an AND-OR-INVERT (AOI) gate 150, and the second multiplexer stage 311 may include a single-stage complex gate such as an OR-AND-INVERT (OAI) gate 151. The 4-input mux 302 takes as input a two-bit select (collectively 402, 401), the inverted version of the two-bit select (collectively 402n, 401n) and a four-bit data (collectively 201a, 201b, 201c, and 201d) and outputs one-bit data 301.

As further illustrated in FIG. 2, the 4-input mux 302 may be combined with a master-slave style flop 303 to achieve a 4-input mux flop 501. The master-slave flop 303 receives the mux output 301 as its data input. The master-slave flop 303 also receives an input clock 300. As shown in FIG. 2, the master-slave flop 303 may be implemented with inverters 103 and transmission gates 109, and it outputs registered data 304b.

Most often, the datapath logic forms the timing critical path, setting the clock frequency of the IC. Therefore, significant design effort is spent in reducing the logic depth between pipeline stages.

Figure 3:
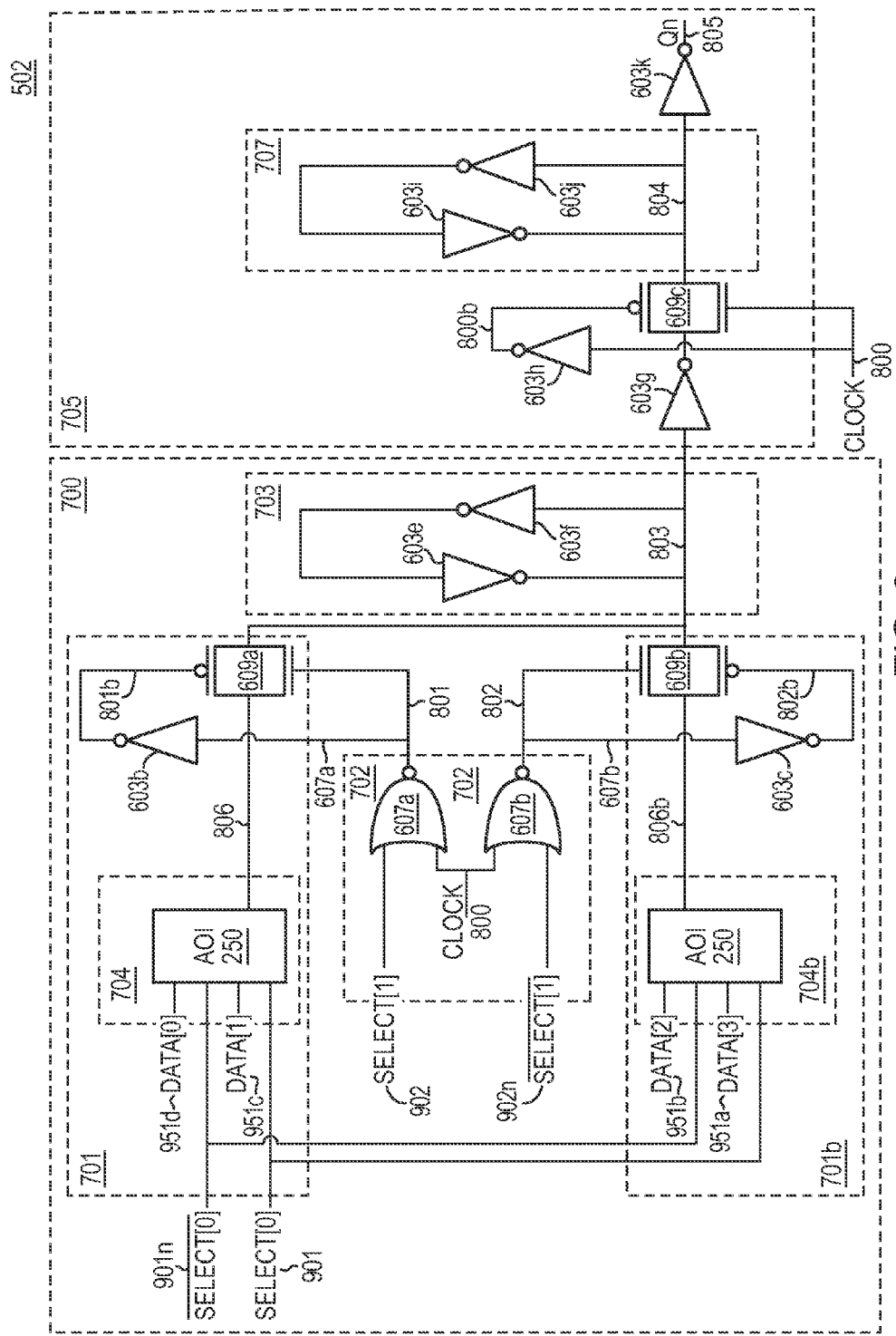
FIG. 3 illustrates an example embodiment of a 4-input mux flop in accordance with the present invention.

In an example embodiment of the present invention, shown in FIG. 3, a 4-input high performance mux flop 502 is constructed. Although static CMOS logic is used to construct the flop in FIG. 3, one skilled in the art realizes that other types of logic may be used instead of CMOS logic.

In a common case, mux select input, select (collectively, 902, 901 as shown in FIG. 3), is not timing critical. The present invention exploits this feature, in order to reduce logic depth, by moving the second stage muxing from the data logic to the clock logic. Further logic depth reduction is achieved by moving the first mux stage into the flop (replacing inverters with complex gates). These circuit changes remove two logic stages from the timing critical path, thereby increasing the chip clock frequency.

As illustrated in FIG. 3, each leg 701, 701b of the master latch 700 has only one mux stage, compared with the two mux stages, 310, 311, of FIG. 2. Each leg has a single mux stage that includes a corresponding combinatorial logic block (704, or 704b, respectively) that may be implemented with a single-stage complex gate such as an AND-OR-INVERT (AOI) gate 250. Each combinatorial logic block takes two data bits as input (951a, 951b for 704b, and 951c, 951d for 704) and also takes the lower select bit 901 and its inverse 901n as inputs.

As shown in FIG. 3, each of the legs (701 or 701b, respectively) includes inverter(s) (603b for leg 701, or 603c for leg 701b), and a transmission gate (609a or 609b, respectively). In the master latch 700, the data output (806 or 806b, respectively) of each combinatorial logic block (704 or 704b, respectively) is driven into a corresponding transmission gate (609a or 609b, respectively) which in turn drives data out 803 to a master storage element 703 which is comprised of two inverters 603e, 603f.

In FIG. 3, the clock selection logic 702 receives the upper select bit 902, the inverse of the upper select bit 902n, and the clock input 800, and provides two generated clocks 801, 802. A purpose of the upper select bit 902 and its inverse 902n is to allow the clock selection logic 702 to enable one of the generated clocks 801, 802, which in turn enables the corresponding data leg (701 or 701b, respectively) to operate the master latch 700 and transmit data 803 to the master storage element 703. Each leg receives the generated clock (801 or 802 as shown in FIG. 3) and produces an inverted form of the generated clock (801b or 802b, respectively) using inverters (603b or 603c, respectively) for use to enable the corresponding transmission gate (609a or 603b, respectively). The clock selection logic 702 may be implemented using two NOR gates 607a, 607b.

The master latch 700 drives data 803 into the slave latch 705. The slave latch drives this data through an inverter 603g, then through a transmission gate 609c that is enabled by the clock 800 and an inverted version of the clock 800b (inverted using an inverter 603h). In the slave latch 705, the transmission gate 609c drives a storage element 707 that is comprised of two inverters 603i, 603j. In the slave latch 705, the output of the storage element 804 is driven through an inverter 603k which outputs data 805 from the mux flop 502.

Note that one of ordinary skill in the art appreciates that inverters, inverted inputs/output, and other circuit elements, may be added or removed from the circuits described herein, in order to modify the circuit functionality (data, clocks, or other circuitry) as needed for a given application. Therefore, the present invention is not limited to the exact circuits shown herein and may be extended, while still relying upon the concepts of the present invention.

The present invention may be applied to any type of circuit, including, but not limited to, electronic circuits, semiconductors, integrated circuits, Very Large Scale Integrated Circuits (VLSI ICs), Complementary Metal-Oxide-Semiconductors (CMOS), Application Specific Integrated Circuits (ASICs), circuitry on printed circuit boards (PCBs), microprocessors (also known as "processors"), nanotechnology circuits, and other types of circuits.

While this invention has been particularly shown and described with references to example embodiments thereof, it will be understood by those skilled in the art that various changes in form and details may be made therein without departing from the scope of the invention encompassed by the appended claims.

What is claimed is:

1. A flip flop circuit comprising:
a master latch comprising a master storage element, a first data leg, and a second data leg, the first and second data legs coupled to the master storage element, and clock selection logic coupled to the first and second data legs, the clock selection logic having a select input for selecting between the first and second data legs; and
a slave latch coupled to the master latch, the slave latch including a slave storage element,
wherein the clock selection logic comprises first and second NOR gates, the first and second NOR gates each sharing and receiving a single clock input, the first NOR gate receiving the select input, the second NOR gate receiving an inverse of the select input, the first NOR gate generating a first clock output which enables a first data output of the first data leg to a first node of the master storage element, and the second NOR gate generating a second clock output which enables a second data output of the second data leg to the first node of the master storage element.

2. The flip flop circuit of claim 1, wherein each data leg receives a plurality of data inputs.

3. The flip flop circuit of claim 1, wherein each data leg comprises a combinatorial logic block that is coupled to a transmission gate.

4. The flip flop circuit of claim 3, wherein the combinatorial logic block is a single-stage of a multiplexer.

5. The flip flop circuit of claim 1, wherein the clock selection logic has a single clock input, the select input and the single clock input being operatively coupled by the clock selection logic to provide generated clocks, including a first generated clock output enabling a data output of the first data leg to a first node of the master storage element, and a second generated clock output enabling a data output of the second data leg to the first node of the master storage element.

6. The flip flop circuit of claim 5, wherein each generated clock is inverted for an active low enable input, to enable the data output of each data leg.

7. The flip flop circuit of claim 1, wherein the flip flop circuit has a single clock input.

8. The flip flop circuit of claim 7, wherein the slave latch comprises a transmission gate that drives the slave storage element.

9. The flip flop circuit of claim 7, wherein the slave latch has a data input that drives a transmission gate, an output of the transmission gate driving the slave storage element.

10. The flip flop circuit of claim 8, wherein the transmission gate is enabled by the single clock input.

11. The flip flop circuit of claim 10, wherein the single clock input is inverted for an active low enable input, to enable the transmission gate.

12. The flip flop circuit of claim 1, wherein the master storage element and the slave storage element are each comprised of a given first inverter and a given respective second inverter, the given first inverter driving the given respective second inverter, and the given respective second inverter driving the given first inverter.

13. The flip flop circuit of claim 1, wherein the master storage element is comprised of a first inverter and a second inverter and the slave storage element is comprised of a third inverter and a fourth inverter.

14. The flip flop circuit of claim 1, wherein at least one of the first data leg and the second data leg drives the first node of the master storage element, the master storage element being comprised of first and second master storage inverters, the first master storage inverter driving an input of the second master storage inverter and the second master storage inverter driving an input of the first master storage inverter, a slave inverter driving data of the first node of the master storage element to a slave transmission gate, the slave transmission gate driving data received by the slave inverter to the slave storage element, the slave storage element being comprised of first and second slave storage inverters, the first slave storage inverter driving an input of the second slave storage inverter and the second slave storage inverter driving an input of the first slave storage inverter.

15. The flip flop circuit of claim 1, wherein the slave storage element stores slave data generated by at least one of the first data leg and the second data leg.

16. The flip flop circuit of claim 15, wherein the slave data is generated by the at least one of the first data leg and the second data leg without requiring one or more scan inputs.

17. The flip flop circuit of claim 15, wherein the slave latch outputs the slave data without requiring at least one of a reset input and a preset input.

18. The flip flop circuit of claim 1, wherein each of the first and second NOR gates is a two-input NOR gate.

19. A flip flop circuit comprising:
a master latch comprising a master storage element, a first data leg, and a second data leg, the first and second data legs coupled to the master storage element, and clock selection logic coupled to the first and second data legs, the clock selection logic having a select input for selecting between the first and second data legs; and
a slave latch coupled to the master latch, the slave latch including a slave storage element,
wherein each data leg comprises a combinatorial logic block that is coupled to a transmission gate and the combinatorial logic block comprises at least one of an AND-OR-INVERT (AOI) gate and an OR-AND-INVERT (OAI) gate.

* * * * *